(12) United States Patent
Lee

(10) Patent No.: US 8,228,086 B2
(45) Date of Patent: Jul. 24, 2012

(54) SOCKET FOR TESTING SEMICONDUCTOR CHIP

(75) Inventor: Chae Yoon Lee, Busan (KR)

(73) Assignee: Leeno Ind. Inc. (KR)

( * ) Notice: Subject to any disclaimer, the term of this patent is extended or adjusted under 35 U.S.C. 154(b) by 324 days.

(21) Appl. No.: 12/722,402

(22) Filed: Mar. 11, 2010

(65) Prior Publication Data

US 2011/0102008 A1    May 5, 2011

(30) Foreign Application Priority Data

Nov. 4, 2009    (KR) .................. 10-2009-0105817

(51) Int. Cl.
*G01R 31/02* (2006.01)
(52) U.S. Cl. .......... 324/756.02; 324/756.01; 324/762.01
(58) Field of Classification Search .................. None
See application file for complete search history.

(56) References Cited

U.S. PATENT DOCUMENTS

| | | | | |
|---|---|---|---|---|
| 6,222,377 B1 * | 4/2001 | Kato | .................. | 324/750.25 |
| 6,225,817 B1 * | 5/2001 | Sayre et al. | .................. | 324/750.25 |
| 6,989,681 B2 * | 1/2006 | Maekawa et al. | .................. | 324/754.03 |
| 7,501,839 B2 * | 3/2009 | Chan et al. | .................. | 324/754.18 |

FOREIGN PATENT DOCUMENTS

| | | |
|---|---|---|
| JP | 2005-209606 A | 8/2005 |
| KR | 10-2009-0053460 A | 5/2009 |
| KR | 10-2009-0104659 A | 6/2009 |

\* cited by examiner

*Primary Examiner* — Vinh Nguyen
(74) *Attorney, Agent, or Firm* — Park & Associates IP Law, P.C.

(57) ABSTRACT

A socket for testing a semiconductor chip includes a base cover, a conductive sheet, upper plungers, a housing, lower plungers and a support plate. The base cover has a coupling opening in the central portion thereof, and the conductive sheet is fitted into the coupling opening of the base cover and includes conductive parts and an insulation part. The upper plungers are seated onto upper ends of the conductive parts and come into contact with corresponding terminals of the semiconductor chip. The housing has insert holes at positions corresponding to the upper plungers and fastens the upper plungers to the corresponding conductive parts. The lower plungers are provided under lower ends of the conductive parts and come into contact with corresponding terminals of a PCB to electrically connect the conductive parts to the PCB. The support plate has holes at positions corresponding to the lower plungers and fastens the lower plungers to the lower ends of the corresponding conductive parts such that lower ends of the lower plungers protrude outside through the holes of the support plate.

19 Claims, 8 Drawing Sheets

SOCKET FOR TESTING SEMICONDUCTOR CHIP

FIELD OF THE INVENTION

The present invention relates generally to sockets for testing semiconductor chips and, more particularly, to a socket for testing semiconductor chips in which plungers are provided in the upper and lower portions of conductive parts of a conductive sheet, thus enhancing the reliability of a test.

BACKGROUND OF THE INVENTION

As is well known to those skilled in the art, semiconductor chips must be tested for whether they are normal or not. Typically, a semiconductor chip is tested in such a way that test probes which are mounted to a test socket are brought into contact with the semiconductor chip and test current is applied to a test circuit board.

Of such devices for testing semiconductor chips, there is an anisotropic conductive sheet which can reduce damage to connection terminals (solder balls) of a semiconductor chip. In the anisotropic conductive sheet, conductive silicone parts are formed by vertically arranging metal balls (powder) in a main body made of silicone. Test current is applied through the conductive silicone parts to a test circuit board disposed under the main body, thus determining whether the semiconductor chip is normal.

To detect initial failure of a semiconductor chip, when the anisotropic conductive sheet is used as an electrical connection member of a test socket which is used in a heating test, a heat-cycle test, etc., if the anisotropic conductive sheet in which a positioning hole is formed in a resin film is used, electrodes of the anisotropic conductive sheet may be misaligned with respect to electrodes of an object to be tested because of thermal expansion of the resin film. As a result, stable and correct electric contact is not ensured, so that the reliability of the test deteriorates.

In an effort to overcome these problems, an anisotropic conductive sheet assembly was proposed in Korean Patent Laid-open Publication No. 2000-45941 which was entitled 'Anisotropic conductive sheet with positioning means'.

In this conventional technique, the anisotropic conductive sheet assembly includes a positioning means for exactly positioning electrodes of the anisotropic conductive sheet with respect to circuit components having fine electrode pitches. When the anisotropic conductive sheet assembly is used as an electric connection member between the circuit components and a circuit board in a test or measurement of the circuit components or the circuit board, stable contact and reliable electric conduction can be ensured.

In detail, as shown in FIGS. 1 and 2, the anisotropic conductive sheet assembly of No. 2000-45941 includes an anisotropic conductive sheet 11 and a positioning metal plate 16. The anisotropic conductive sheet 11 includes conductive parts 12 which are provided in the anisotropic conductive sheet in thickness directions and are made of conductive material, and an insulation part 8 which is made of elastic insulation material and is formed in an area of the anisotropic conductive sheet outside of the conductive parts 12. The positioning metal plate 16 has positioning means 10 which is formed at predetermined positions around the anisotropic conductive sheet 11.

The anisotropic conductive sheet assembly having the above-mentioned construction is interposed between the circuit components and the circuit board and is pushed by a pressure fixing jig. Hereby, electric connection between the circuit components and the circuit board can be achieved.

Here, the positioning of the conductive parts 12 of the anisotropic conductive sheet 11 with respect both to the electrodes of the circuit components and to an electrode group of the circuit board can be realized by the positioning means 10, such as positioning holes or the like, of the positioning metal plate 16.

However, in the conventional technique, due to repeated tests, the upper and lower surfaces of the conductive parts 12 of the anisotropic conductive sheet 11 are damaged. Thus, the reliability of the test is reduced.

Meanwhile, another conventional technique was proposed in Korean Patent Application No. 10-2009-0017393 which was filed by the applicant of the present invention and entitled 'Socket for testing semiconductor chips'.

As shown in FIGS. 3 and 4, the socket for testing semiconductor chips according to this conventional technique includes a support plate, a silicone base 10, a plurality of conductive silicone parts 20, a plurality of plungers 30 and a cap 80. The support plate has a planar shape. A coupling hole is vertically formed through the central portion of the support plate. The silicone base 10 is coupled to the coupling hole of the support plate. A boss 12 protrudes upwards from the silicone base 10. The conductive silicone parts 20 are formed in the boss 12 by arranging metal balls in vertical directions. The plungers 30 are seated on the conductive silicone parts 20 and come into contact with corresponding solder balls of the semiconductor chip. The cap 80 has insert holes 82 at positions corresponding to the plungers 30. A receiving space 86 is formed in the lower portion of the cap 80 so that the boss 12 is inserted into the receiving space 86. The cap 80 is coupled to the silicone base 10 to fasten the plungers 30 to the silicone base 10.

The upper ends of the plungers 30 come into contact with a device which is an object to be tested. A PCB (printed circuit board) is brought into contact with a lower surface of a lower piece of insulation tape which is attached to the lower surface of the support plate, so that the device is electrically connected to the PCB.

Furthermore, a lower protrusion 38 is provided under the lower end of a cylindrical body 32 of each plunger 30. Depressions 24 having semi-conical shapes are formed in an upper surface of a conductive silicone part 20. Thus, the lower protrusion 38 of each plunger 30 is seated into the corresponding depression 24, such that the plunger 30 can be stably coupled to the conductive silicone part 20, thus preventing the plunger 30 from being displaced from the correct position when the tests are repeated.

Furthermore, a cylindrical tip 39 protrudes downwards from the central portion of each lower protrusion 38. The cylindrical tip 39 is inserted into a receiving recess 26 which is formed in the corresponding depression 24, so that the plunger 30 can be disposed at the correct position.

In the technique of No. 10-2009-0017393, the contact efficiency between the socket and the device can be enhanced by installation of the plungers 30. However, foreign substances may be caught between the lower surfaces of the conductive silicone parts 20 and the PCB, with the result that contact resistance increases because of the foreign substances, thus reducing the reliability of the test.

SUMMARY OF THE INVENTION

Accordingly, the present invention has been made keeping in mind the above problems occurring in the prior art, and an object of the present invention is to provide a socket for testing semiconductor chips in which plungers are provided in the upper and lower portions of conductive parts of a conductive sheet, and a device and a PCB are connected to each other through the plungers, thus enhancing the reliability of a test.

In order to accomplish the above object, the present invention provides a socket for testing a semiconductor chip, including: a base cover having a planar shape, with a coupling opening formed through a central portion of the base cover in a thickness direction; a conductive sheet fitted into the coupling opening of the base cover, the conductive sheet having conductive parts provided in the conductive sheet in thickness directions, each of the conductive parts being made of conductive material, and an insulation part formed in an area of the conductive sheet other outside the conductive parts, the insulation part being made of elastic insulation material; a plurality of upper plungers seated onto upper ends of the conductive parts of the conductive sheet, the upper plungers coming into contact with corresponding terminals of the semiconductor chip; a housing having insert holes at positions corresponding to the upper plungers, the housing fastening the upper plungers to the upper ends of the corresponding conductive parts of the conductive sheet such that upper ends of the upper plungers protrude outside through the insert holes of the housing; a plurality of lower plungers provided under lower ends of the conductive parts of the conductive sheet, the lower plungers coming into contact with corresponding terminals of a PCB (printed circuit board) to electrically connect the conductive parts to the PCB; and a support plate having holes at positions corresponding to the lower plungers, the support plate fastening the lower plungers to the lower ends of the corresponding conductive parts of the conductive sheet such that lower ends of the lower plungers protrude outside through the holes of the support plate.

The housing may include: an upper housing body having the insert holes at positions corresponding to the upper plungers, the upper housing body being disposed above the conductive sheet to fasten the upper plungers to the upper ends of the corresponding conductive parts of the conductive sheet; and a lower housing body integrally extending from a periphery of the upper housing body such that the lower housing body is stepped from the upper housing body. The lower housing body surrounds the base cover. Positioning means are formed in the lower housing body.

The positioning means may comprise positioning holes formed through the lower housing body in a thickness direction.

Furthermore, each of the upper plungers may include: an upper plunger body having a cylindrical shape; a probe provided on an upper end of the upper plunger body, the probe coming into contact with the corresponding terminal of the semiconductor chip; and a contact part provided under a lower end of the upper plunger body. The contact part comes into contact with the corresponding conductive part of the conductive sheet.

Preferably, an annular protrusion may be provided around the circumferential outer surface of the lower end of the upper plunger body.

In addition, a protrusion may protrude downwards from the lower end of the contact part.

As well, through holes may be formed through the base cover in the thickness direction thereof at positions adjacent to the coupling opening.

Moreover, an upper depression may be depressed downwards from the upper end of each of the conductive parts. An upper seating recess may be depressed downwards from the central portion of the bottom of the upper depression.

The base cover may be coupled to the housing by bolt coupling.

Furthermore, recess holes may be formed to predetermined depths in the upper surface of the insulation part of the conductive sheet.

In addition, the lower surface of the housing is adhered to the conductive sheet by a silicone adhesive.

Preferably, each of the upper plungers may include: an upper plunger body having a cylindrical shape; a probe provided on the upper end of the upper plunger body, the probe coming into contact with the corresponding terminal of the semiconductor chip; a contact part provided under the lower end of the upper plunger body, the contact part coming into contact with the corresponding conductive part of the conductive sheet; and a coupling hole formed through the upper plunger in an axial direction.

Furthermore, a coupling protrusion may protrude upwards from the upper end of each of the conductive parts. The coupling protrusion may be inserted into the coupling hole of the corresponding upper plunger.

In addition, a lower depression may be depressed upwards from the lower end of each of the conductive parts.

As well, a lower seating recess may be depressed upwards from the central portion of the bottom of the lower depression.

Preferably, each of the lower plungers may include: a lower plunger body having a cylindrical shape; a lower terminal contact part provided under a lower end of the lower plunger body, the lower terminal contact part coming into contact with the corresponding terminal of the PCB; and a conductive contact part provided on an upper end of the lower plunger body, the conductive contact part coming into contact with the corresponding conductive part of the conductive sheet.

Furthermore, a conductive protrusion may protrude upwards from the upper end of the conductive contact part. In addition, an annular protrusion may be provided around the circumferential outer surface of the lower plunger body.

As such, the socket uses conductive elastic material, and plungers are provided on the upper and lower portions of the socket. Thus, the reliability of a test can be enhanced.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, preferred embodiments of the present invention will be described in detail with reference to the attached drawings.

<First Embodiment>

Figure 1:
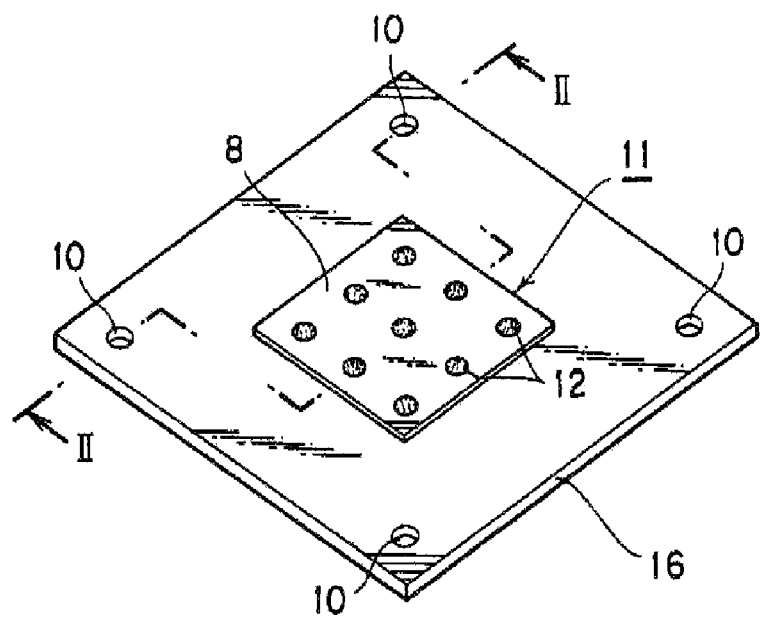
FIG. 1 is a perspective view showing an anisotropic conductive sheet, according to a conventional technique.
Figure 2:
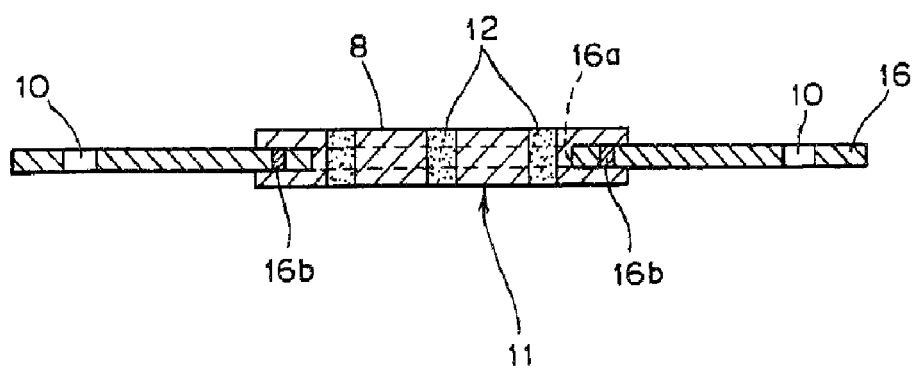
FIG. 2 is a sectional view of a critical portion of FIG. 1.
Figure 3:
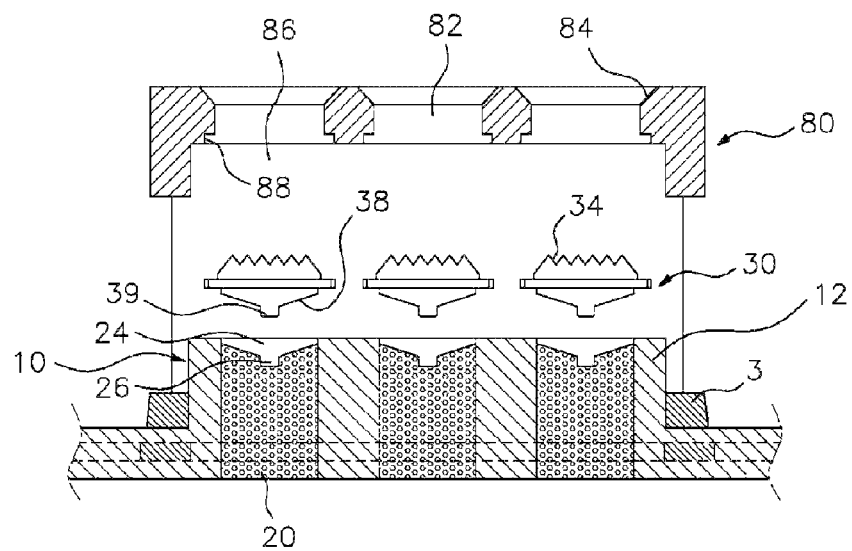
FIG. 3 is a sectional view of a critical portion of a socket for testing semiconductor chips, according to another conventional technique.
Figure 4:
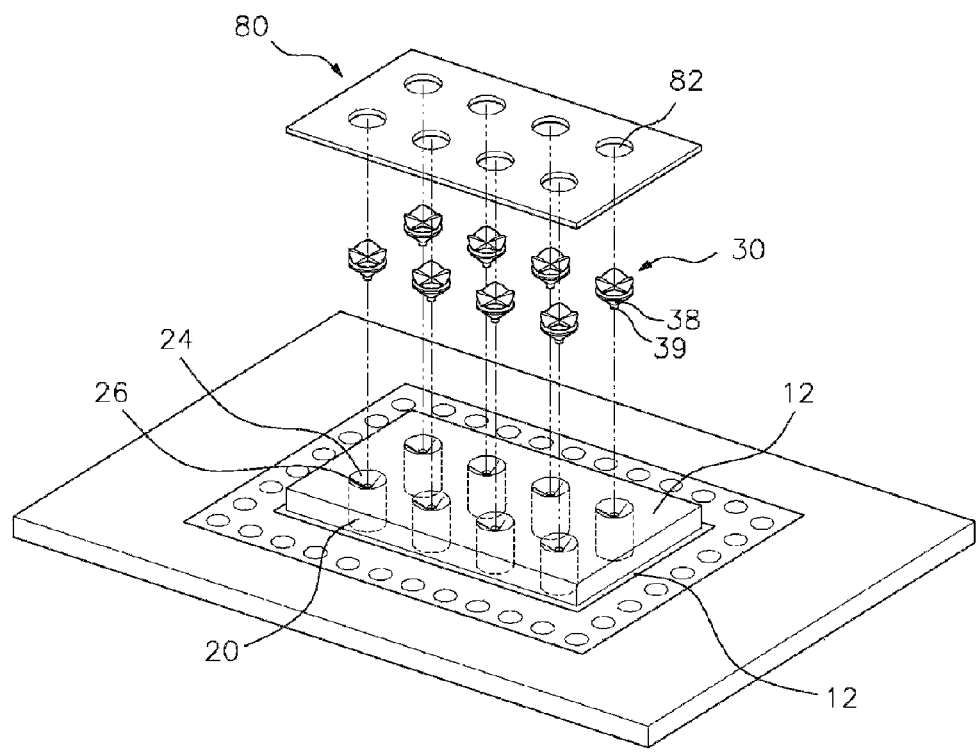
FIG. 4 is an exploded perspective view of FIG. 3.
Figure 5:
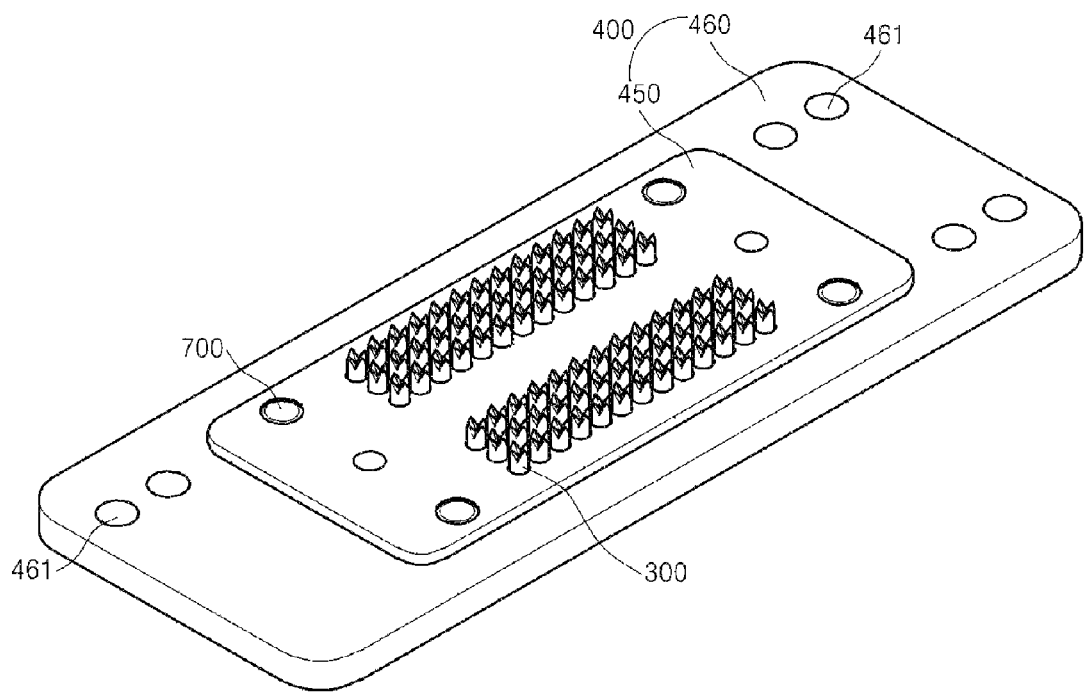
FIG. 5 is a perspective view of a socket for testing semiconductor chips, according to a first embodiment of the present invention.
Figure 6:
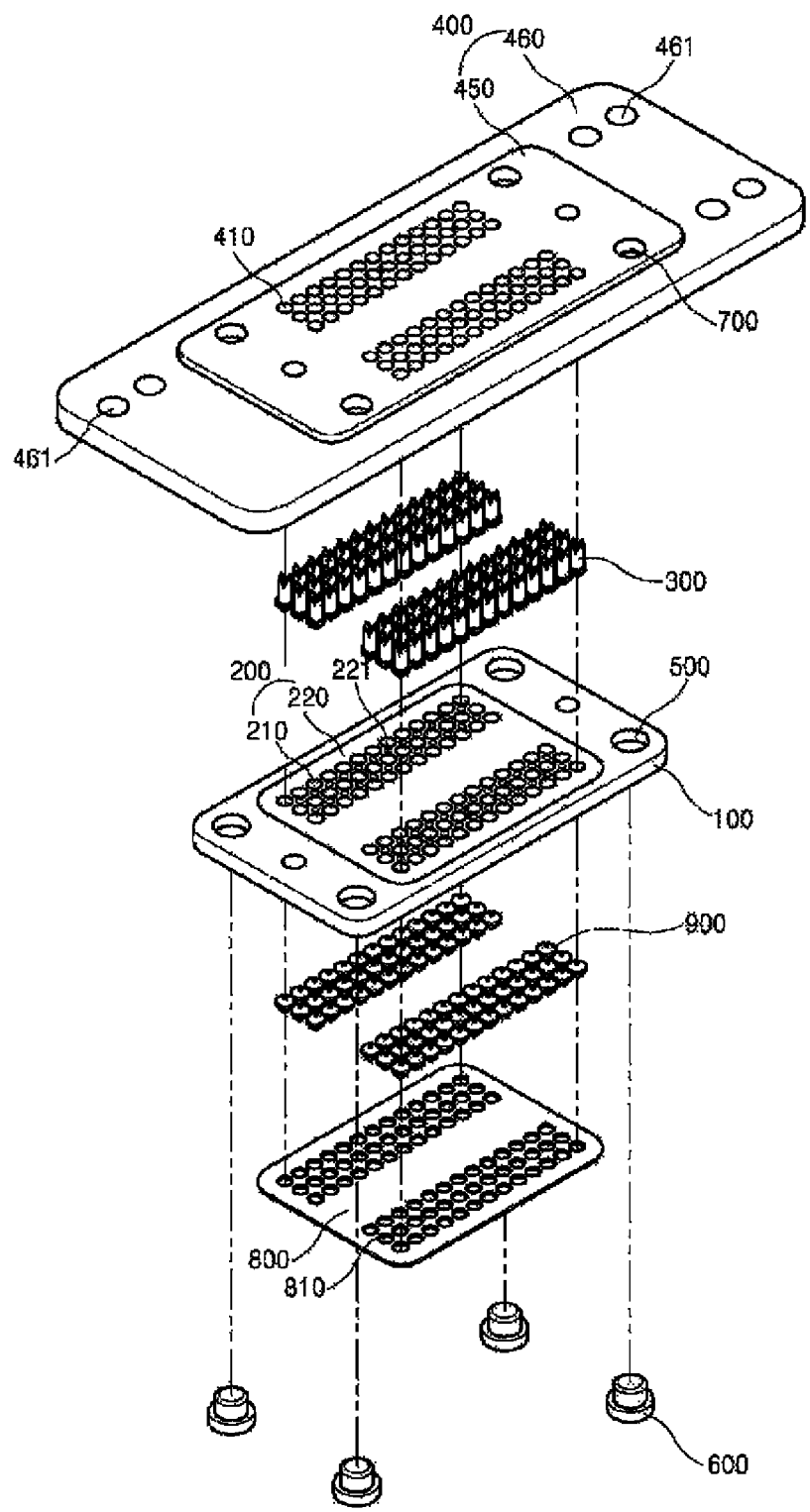
FIG. 6 is an exploded perspective view of the socket according to the first embodiment of the present invention.
Figure 7:
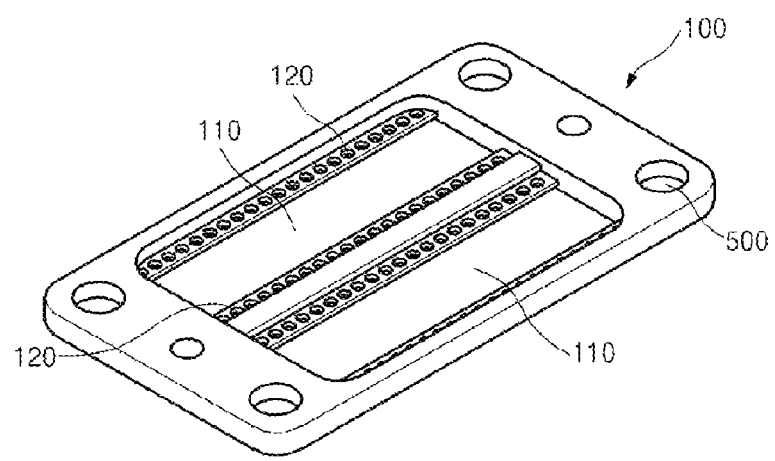
FIG. 7 is a perspective view of a base cover according to the first embodiment of the present invention.
Figure 8:
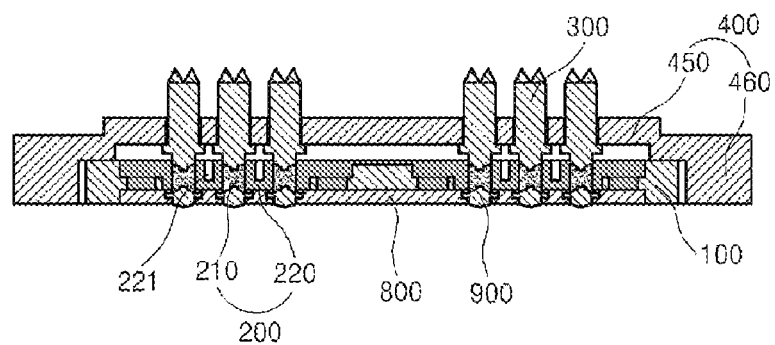
FIG. 8 is a sectional view of a critical portion of the socket provided with plungers according to the first embodiment of the present invention.
Figure 9:
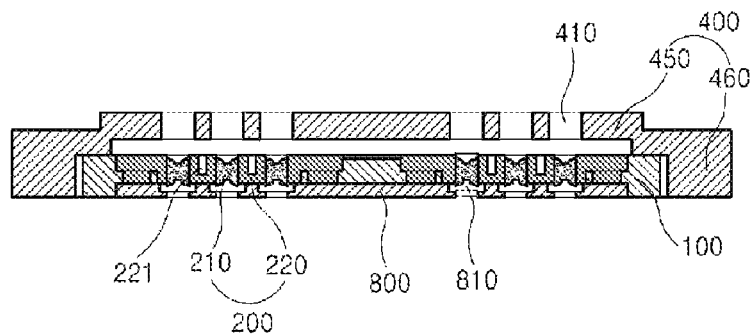
FIG. 9 is a sectional view of the critical portion of the socket from which the plungers are removed according to the first embodiment of the present invention.
Figure 10:
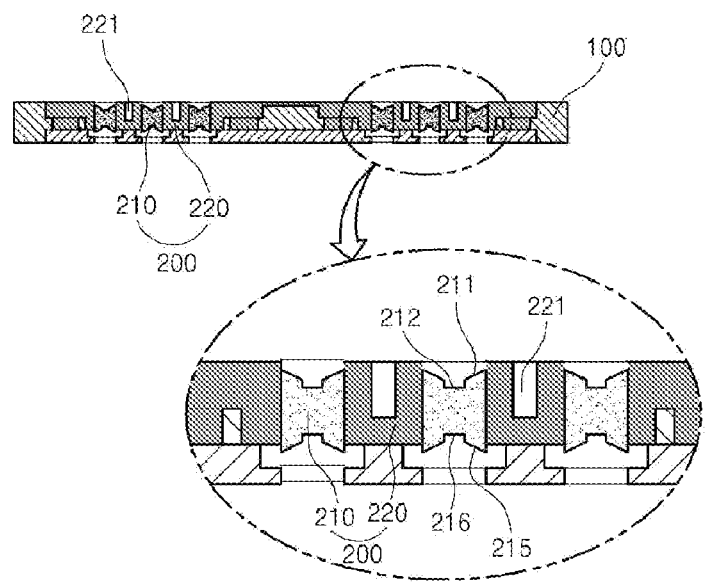
FIG. 10 is a sectional view showing the coupling of a conductive sheet to the base cover according to the first embodiment of the present invention.
Figure 11:
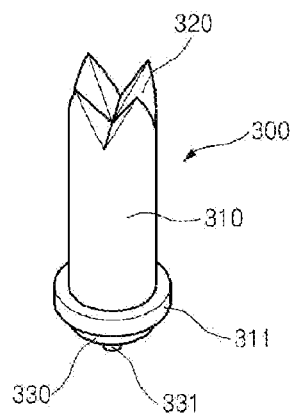
FIG. 11 is a perspective view of an upper plunger according to the first embodiment of the present invention.
Figure 12:
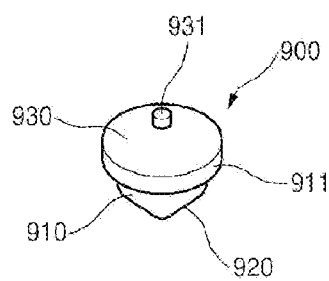
FIG. 12 is a perspective view of a lower plunger according to the first embodiment of the present invention.

FIG. 5 is a perspective view of a socket for testing semiconductor chips, according to a first embodiment of the present invention. FIG. 6 is an exploded perspective view of the socket. FIG. 7 is a perspective view of a base cover 100 of the socket. FIG. 8 is a sectional view of a critical portion of the socket provided with plungers 800. FIG. 9 is a sectional view of the critical portion of the socket from which the plungers 800 have been removed. FIG. 10 is a sectional view showing the coupling of a conductive sheet 200 to the base cover 100. FIG. 11 is a perspective view of an upper plunger 300 of the socket. FIG. 12 is a perspective view of a lower plunger 900 of the socket.

As shown in the drawings, the socket for testing semiconductor chips according to the first embodiment of the present invention includes the base cover 100, the conductive sheet 200, the upper plunger 300, a housing 400, a support plate 800 and the lower plunger 900.

First, the base cover 100 will be explained.

The base cover 100 is planar and is made of synthetic resin. Coupling openings 110 are formed through the central portion of the base cover 100 in vertical directions. The conductive sheet 200 which will be explained later is fitted into the coupling openings 110. Through holes 120 are formed through the base cover 100 in vertical directions at positions adjacent to the coupling openings 110. Each through hole 120 is smaller than the coupling opening 110.

The conductive sheet 200 which will be explained later is formed in the coupling openings 110 of the base cover 100 by insert injection molding. Here, to increase the coupling force between the base cover 100 and the conductive sheet 200, the through holes 120 are formed through the base cover 100 around the coupling openings 110. Thus, when injection molding, an insulation part 220 of the conductive sheet 200 which is made of silicone is formed through the through holes 120 of the base cover 100 and fastened to the base cover 100. Hereby, the conductive sheet 200 can be reliably fastened to the base cover 100. This is a well known technique which was also used in the conventional socket manufacturing technique, and therefore further explanation will be omitted.

Furthermore, bolt coupling holes 500 are formed through the base cover 100 at positions adjacent to both ends of the base cover 100. Thus, the base cover 100 is coupled to the housing 400 by bolts 600.

The conductive sheet 200 includes conductive parts 210 and the insulation part 220.

The insulation part 220 is formed by insert injection molding using silicone such that the insulation part 220 has a planar shape having a predetermined thickness and is coupled to the base cover 100. The conductive parts 210 are vertically provided at predetermined positions in the insulation part 220. Each conductive part 210 is formed in such a way as to pile conductive metal powder in the vertical direction.

In other words, the conductive part 210 is configured such that metal powder is piled up in the vertical direction, so that electricity can be transmitted from the top thereof to the bottom thereof. In addition, the upper plungers 300 which will be explained later respectively come into contact with the upper ends of the conductive parts 210. The lower plungers 900 which will be explained later respectively come into contact with the lower ends of the conductive parts 210.

Furthermore, an upper depression 211 is formed in the upper end of each conductive part 210 in a shape in which it is depressed downwards from the upper end of the conductive part 210. An upper seating recess 212 is further depressed downwards from the central portion of the bottom of the upper depression 211. Each upper plunger 300 is coupled into the upper depression 211 and the upper seating recess 212 of the corresponding conductive part 210. Here, a contact part of the upper plunger 300 is seated into the upper depression 211, and a protrusion of the upper plunger 300 is seated into the upper seating recess 212. Hereby, the upper plunger 300 is electrically connected to the conductive part 210.

A lower depression 215 is formed in the lower end of each conductive part 210 in a shape in which it is depressed upwards from the lower end of the conductive part 210. A lower seating recess 216 is further depressed upwards from the central portion of the top of the lower depression 215. Each lower plunger 900 is coupled into the lower depression 215 and the lower seating recess 216 of the corresponding conductive part 210. Here, a conductive contact part of the lower plunger 900 is seated into the lower depression 215, and a conductive protrusion of the lower plunger 900 is seated into the lower seating recess 216. Hereby, the lower plunger 900 is electrically connected to the conductive part 210.

In addition, recess holes 221 are depressed downwards from the upper surface of the insulation part 220 to predetermined depths. Hence, even though pressure is transmitted to the conductive parts 210 by pushing force of the upper plungers 300 and the conductive parts 210 are thus expanded, the recess holes 221 can absorb the expansion pressure of the conductive parts 210.

Each upper plunger 300 which is coupled to the corresponding conductive part 210 is made of conductive material and includes an upper plunger body 310, a probe 320 and a contact part 330. The upper plungers 300 electrically connect the conductive parts 210 of the conductive sheet 200 to a device to be tested.

The upper plunger body 310 has a cylindrical shape having a predetermined length and forms the central portion of the upper plunger 300. The upper portion of the upper plunger body 310 protrudes upwards through an upper end of a corresponding insert hole 410 of the housing 400 which will be explained later.

The probe 320 has a crown shape and is integrally provided on the upper end of the upper plunger body 310. The probe 320 is electrically connected to a corresponding terminal of the device to be tested. Furthermore, the probe 320 protrudes upwards from the upper end of the insert hole 410 of the housing 400.

An annular protrusion 311 is provided around the circumferential outer surface of the lower end of the upper plunger body 310. The upper surface of the annular protrusion 311 is stopped by the lower surface of the housing 400 around the lower end of the insert hole 410, so that the upper plunger 300 can correctly come into contact with the corresponding conductive part 210 and be prevented from being undesirably removed from the housing 400.

The contact part 330 has a reverse-conical shape and is integrally provided under the annular protrusion 311. The contact part 330 is seated and coupled into the upper depression 211 of the conductive part 210. The protrusion 331 integrally protrudes downwards from the lower end of the contact part 330. The protrusion 331 is seated and coupled into the upper seating recess 212 formed in the conductive part 210. As such, because the contact part 330 and the protrusion 331 are provided on the upper plunger 300 and the upper depression 211 and the upper seating recess 212 are formed in the conductive part 210, the upper plunger 300 can be reliably electrically connected to the conductive part 210 by the coupling of the contact part 330 and the protrusion 331 into the upper depression 211 and the upper seating recess 212.

The housing 400 defines a space in the lower surface thereof. The conductive sheet 200 and the base cover 100 are contained in the space of the housing 400 in a shape in which the housing 400 covers the upper surface of the conductive sheet 200 and surrounds the periphery of the base cover 100. The housing 400 is coupled to the base cover 100 by bolts.

The housing 400 comprises an upper housing body 450 and a lower housing body 460.

The upper housing body 450 has a planar shape and is made of synthetic resin. The insert holes 410 are formed through the upper housing body 450 at positions corresponding to the upper plungers 300. The upper housing body 450 is disposed above the conductive sheet 200 and connects the upper plungers 300 to the upper ends of the corresponding conductive parts 210.

Here, the upper portions of the main bodies 310 of the upper plungers 300 protrude upwards from the upper ends of the corresponding insert holes 410 of the upper housing body 450. The contact parts 330 of the upper plungers 300 are disposed below the insert holes 410. The upper surfaces of the annular protrusions 311 of the main bodies 310 come into close contact with the lower surface of the upper housing body 450 around the lower ends of the insert holes 410. Hereby, the upper plungers 300 can be stably coupled to the upper housing body 450 and prevented from being undesirably removed from the upper housing body 450. Furthermore, bolt coupling holes 700 are formed through the upper housing body 450 at positions which are adjacent to both ends of the upper housing body 450 and correspond to the bolt coupling holes 500 formed through the base cover 100. Thus, the base cover 100 and the housing 400 are coupled to each other by bolts 600.

The lower housing body 460 integrally extends from the periphery of the upper housing body 450 such that the lower housing body 460 is stepped from the upper housing body 450. The lower housing body 460 surrounds the periphery of the base cover 100. A positioning means is formed in the lower housing body 460 at positions adjacent to both ends thereof. In the embodiment, positioning holes 461 which are formed through the lower housing body 460 serve as the positioning means. Thus, the lower housing body 460 is positioned with respect to a device to be tested or a jig for the device in such a way as to insert positioning pins into the positioning holes 461.

Here, the upper housing body 450 of the housing 400 contains the base cover 100 provided with the conductive sheet 200 in a shape in which the upper housing body 450 covers the upper surface of the base cover 100. The lower housing body 460 surrounds the periphery of the base cover 100. As such, the base cover 100 is contained in the receiving space formed in the lower surface of the housing 400 and coupled to the housing 400. Hereby, the upper plungers 300 which are coupled to the conductive sheet 200 can be stably connected to the conductive parts 210 of the conductive sheet 200.

Meanwhile, the lower plungers 900 are connected to the lower ends of the corresponding conductive parts 210. Each lower plunger 900 is made of conductive material and includes a lower plunger body 910, a lower terminal contact part 920 and a conductive contact part 930. The lower plungers 900 connect terminals of a PCB (printed circuit board) to be tested to the corresponding conductive parts 210 of the conductive sheet 200.

The lower plunger body 910 has a cylindrical shape having a predetermined length and forms the central portion of the lower plunger 900. The lower portion of the lower plunger body 910 protrudes downwards through a corresponding hole 810 of the support plate 800 which will be explained later.

The lower terminal contact part 920 is integrally provided under the lower end of the lower plunger body 910. The lower terminal contact part 920 electrically comes into contact with a corresponding terminal of a PCB to be tested. Here, the lower terminal contact part 920 protrudes downwards from the corresponding hole 810 of the support plate 800.

An annular protrusion 911 is provided around the circumferential outer surface of the upper end of the lower plunger body 910. The lower surface of the annular protrusion 911 is stopped by the upper surface of the support plate 800 around the upper end of the hole 810, so that the lower plunger 900 can correctly come into contact with the lower end of the corresponding conductive part 210 and be prevented from being undesirably removed from the support plate 800.

The conductive contact part 930 has a conical shape and is integrally provided on the annular protrusion 911. The conductive contact part 930 is seated and coupled into the lower depression 215 of the conductive part 210. A conductive protrusion 931 integrally protrudes upwards from the upper end of the conductive contact part 930. The conductive protrusion 931 is seated and coupled into the lower seating recess 216 formed in the lower end of the conductive part 210.

As such, because the conductive contact part 930 and the conductive protrusion 931 are provided on the lower plunger 900 and the lower depression 215 and the lower seating recess 216 are formed in the conductive part 210, the lower plunger 900 can be reliably electrically connected to the conductive part 210 by the coupling of the conductive contact part 930 and the conductive protrusion 931 into the lower depression 215 and the lower seating recess 216.

The support plate 800 is made of synthetic resin and has a planar shape. The holes 801 are formed through the support plate 800 at positions corresponding to the lower plungers 900. The support plate 800 couples the lower plungers 900 to the corresponding conductive parts 210 such that the lower portions of the lower plungers 900 protrude downwards through the holes 810.

The operation and effect of the present invention having the above-mentioned construction will be explained below.

When a user desires to test a device, the device is disposed on the socket, and a PCB is disposed under the socket. Here, the device and the PCB can be easily positioned with respect to the device in such a manner as to insert the positioning pins into the positioning holes 461 of the housing 400.

Then, electrodes of the device come into contact with the upper portions of the probes 320 of the corresponding upper plunger 300. Terminals of the PCB come into contact with the lower portions of the corresponding lower plungers 900.

In this state, the test is conducted. Here, because downward pressure is applied to the device to be tested, the electrodes of the device, the upper plungers 300, the conductive parts 210, the lower plungers 900 and the terminals of the PCB are electrically connected to each other. Hereby, the test for the device can be conducted.

In the present invention, when the test is processed, the upper plungers 300 can be stably disposed in the housing 400 which supports the upper surface and the periphery of the base cover 100. Furthermore, the upper plungers 300 and the lower plungers 900 are stably coupled to the conductive parts 210 of the conductive sheet 200 at correct positions. Therefore, the reliability of the test can be enhanced.

As described above, the present invention is configured such that the upper and lower plungers 300 and 900 are coupled to the conductive sheet 200 by the housing 400 and the support plate 800. Those skilled in the art will appreciate that various modifications, additions and substitutions are possible within the above-mentioned basic scope and spirit of the invention.

<Second Embodiment>

Figure 13:
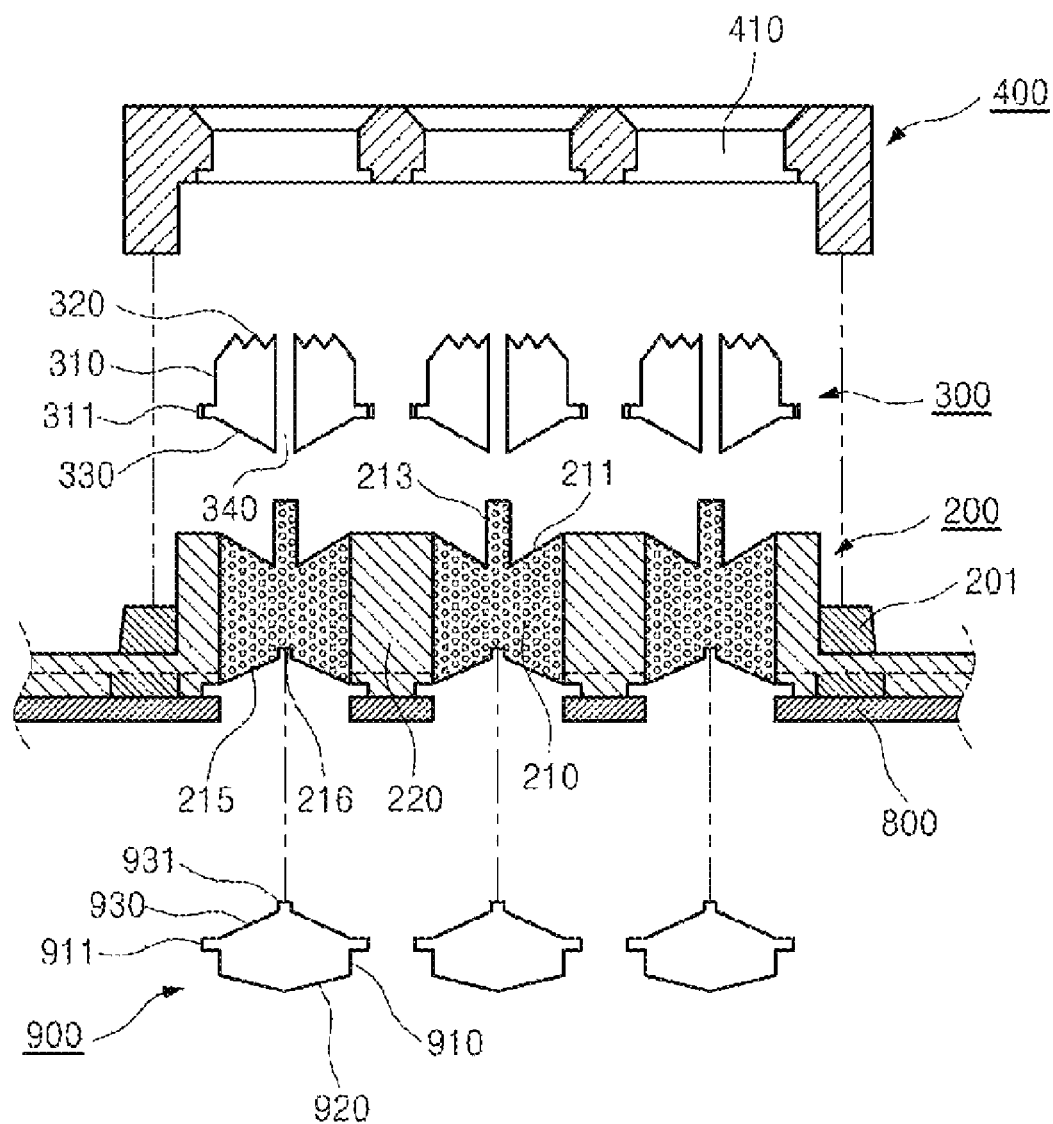
FIG. 13 is a sectional view showing a critical portion of a socket for testing semiconductor chips, according to a second embodiment of the present invention.
Figure 14:
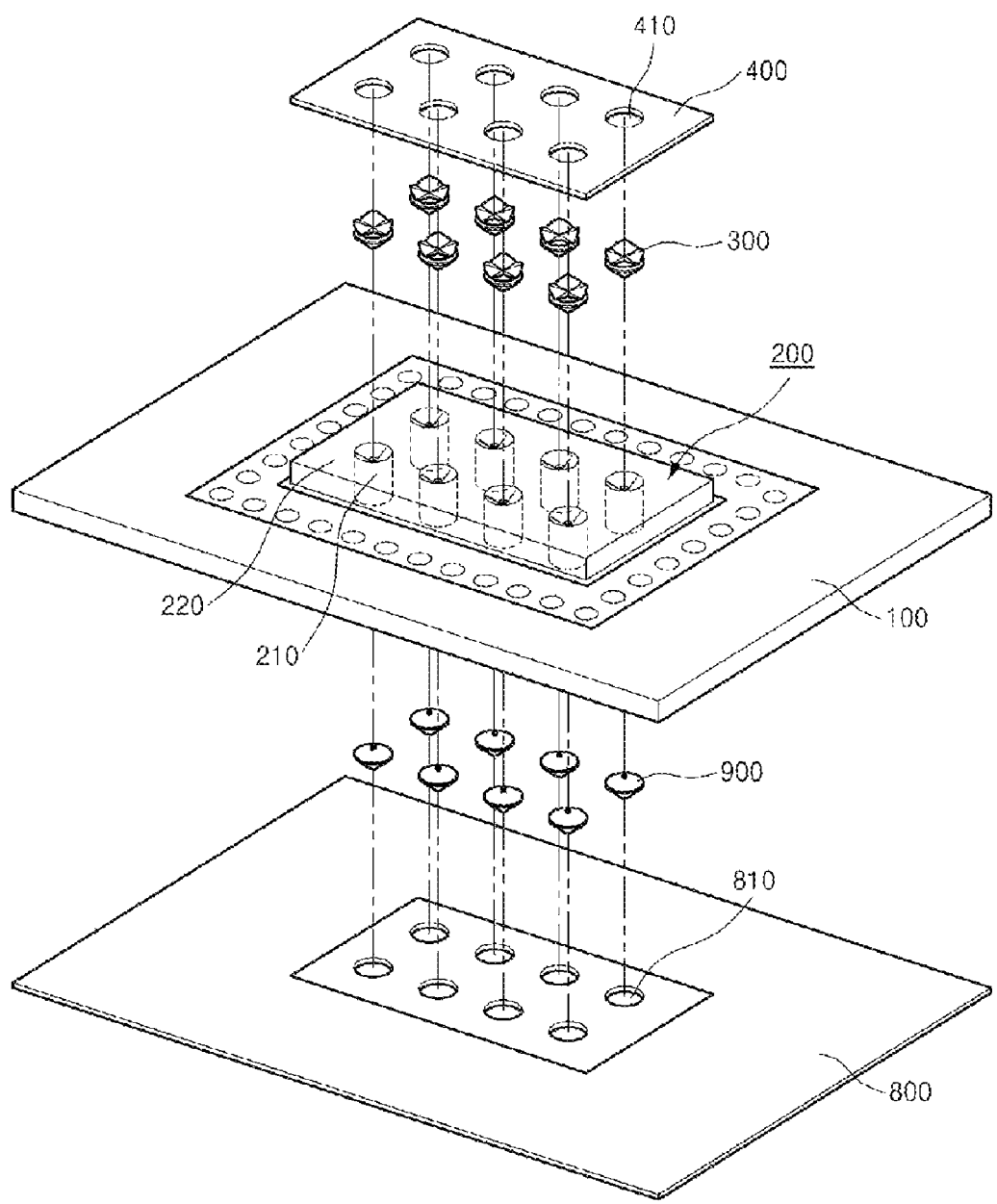
FIG. 14 is an exploded perspective view of the socket according to the second embodiment of the present invention.

FIG. 13 is a sectional view showing a critical portion of a socket for testing semiconductor chips, according to a second embodiment of the present invention. FIG. 14 is an exploded perspective view of the socket according to the second embodiment of the present invention.

As shown in these drawings, the socket according to the second embodiment of the present invention has almost the same construction as that of the first embodiment, other than only the partial structures of the housing and the upper plunger. Hereinafter the socket according to the second embodiment will be described in detail.

A base cover 100 is planar and is made of stainless steel. A coupling opening is formed through the central portion of the base cover 100. A conductive sheet 200 is fitted into the coupling opening of the base cover 100. Furthermore, through holes which are smaller than the coupling opening are formed through the base cover 100 at positions adjacent to the coupling opening. This structure of the second embodiment is almost the same as that of the first embodiment. In addition, the coupling of the conductive sheet 200 to the base cover 100 according to the second embodiment is also similar to that of the first embodiment.

However, in the second embodiment of the present invention, the shape of an upper end of each conductive part 210 of the conductive sheet 200 differs from that of the first embodiment.

In detail, an upper depression 211 is formed in the upper end of the conductive part 210 in a manner similar to that of the first embodiment, but a coupling protrusion 213 protrudes upwards from the central portion of the upper depression 211, unlike in the first embodiment. Thus, the conductive part 210 is coupled to the corresponding upper plunger 300 in such a way that the coupling protrusion 213 is inserted into a coupling hole 340 of the upper plunger 300.

Furthermore, in the same manner as in the first embodiment, each upper plunger 300 which is coupled to the upper end of the conductive part 210 includes an upper plunger body 310, a probe 320 and a contact part 330. The upper plunger 300 electrically connects a device to be tested to the corresponding conductive part 210 of the conductive sheet 200.

The upper plunger body 310 has a cylindrical shape having a predetermined length. The upper portion of the upper plunger body 310 protrudes upwards through an upper end of a corresponding insert hole 410 of the housing 400 which will be explained later.

The probe 320 has a crown shape and is integrally provided on the upper end of the upper plunger body 310. The probe 320 is electrically connected to a corresponding terminal of the device to be tested.

An annular protrusion 311 is provided around the circumferential outer surface of the lower end of the upper plunger body 310. The upper surface of the annular protrusion 311 is stopped by the lower surface of the housing 400 around the lower end of the insert hole 410, so that the upper plunger 300 correctly comes into contact with the corresponding conductive part 210 and is prevented from being undesirably removed from the housing 400.

The contact part 330 has a reverse-conical shape and is integrally provided under the annular protrusion 311. The contact part 330 is seated and coupled into the upper depression 211 of the conductive part 210. The coupling hole 340 is vertically formed through the contact part 330, so that the coupling protrusion 213 of the conductive part 210 is inserted into the coupling hole 340.

As such, because the contact part 330 and the coupling hole 340 are provided in the upper plunger 300, and the upper depression 211 and the coupling protrusion 213 are provided in the conductive part 210, the upper plunger 300 can form a reliable electrical connection to the conductive part 210 because of the coupling of the contact part 330 and the coupling protrusion 213 into the upper depression 211 and the coupling hole 340.

The housing 400 covers the upper portion of the conductive sheet 200. In other words, the housing 400 contains the conductive sheet 200 in a space defined in the lower surface thereof.

In detail, the housing 400 is adhered at the lower surface thereof to the upper surface of the conductive sheet 200 by silicone adhesive 201. The housing 400 is made of engineering plastic, more preferably, Ultem formed by extruding polyetherimide.

The insert holes 410 are formed through the housing 400 at positions corresponding to the upper plungers 300 in vertical directions. The housing 400 is disposed above the conductive sheet 200 and couples the upper plungers 300 to the upper ends of the corresponding conductive parts 210.

Meanwhile, a support plate 800 has a synthetic resin tape shape. Holes 810 are formed through the support plate 800 at positions corresponding to lower plungers 900. In the same manner as in the first embodiment, the lower plungers 900 are coupled to lower ends of the corresponding conductive parts 210 such that the lower portions of the lower plungers 900 protrude downwards through the holes 810 of the support plate 800.

Each lower plunger 900 includes a lower plunger body 910, a lower terminal contact part 920 and a conductive contact part 930. The lower plungers 900 connect terminals of a PCB (printed circuit board) to be tested to the corresponding conductive parts 210 of the conductive sheet 200. The lower plunger 900 has an annular protrusion 911 having the same structure as that of the first embodiment, and the structure of the conductive contact part 930 is also the same as that of the first embodiment.

As such, the socket according to the second embodiment of the present invention is configured such that the upper and lower plungers 300 and 900 are coupled to the conductive sheet 200. Those skilled in the art will appreciate that various modifications, additions and substitutions are possible within the above-mentioned basic scope and spirit of the invention.

As described above, in the present invention, a socket is made of conductive elastic material, and plungers are provided in upper and lower portions of the socket made of conductive material. Thus, the present invention can enhance the reliability of a test.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A socket for testing a semiconductor chip, comprising:
   a base cover having a planar shape, with a coupling opening formed through a central portion of the base cover in a thickness direction;
   a conductive sheet fitted into the coupling opening of the base cover, the conductive sheet comprising: conductive parts provided in the conductive sheet in thickness directions, each of the conductive parts being made of conductive material; and an insulation part formed in an area of the conductive sheet outside the conductive parts, the insulation part being made of elastic insulation material;
   a plurality of upper plungers seated onto upper ends of the conductive parts of the conductive sheet, the upper plungers coming into contact with corresponding terminals of the semiconductor chip;
   a housing having insert holes at positions corresponding to the upper plungers, the housing fastening the upper plungers to the upper ends of the corresponding conductive parts of the conductive sheet such that upper ends of the upper plungers protrude outside through the insert holes of the housing;
   a plurality of lower plungers provided under lower ends of the conductive parts of the conductive sheet, the lower plungers coming into contact with corresponding terminals of a PCB (printed circuit board) to electrically connect the conductive parts to the PCB; and
   a support plate having holes at positions corresponding to the lower plungers, the support plate fastening the lower plungers to the lower ends of the corresponding conductive parts of the conductive sheet such that lower ends of the lower plungers protrude outside through the holes of the support plate.

2. The socket as set forth in claim 1, wherein the housing comprises:
   an upper housing body having the insert holes at positions corresponding to the upper plungers, the upper housing body being disposed above the conductive sheet to fasten the upper plungers to the upper ends of the corresponding conductive parts of the conductive sheet; and
   a lower housing body integrally extending from a periphery of the upper housing body such that the lower housing body is stepped from the upper housing body, the lower housing body surrounding the base cover, with positioning means formed in the lower housing body.

3. The socket as set forth in claim 2, wherein the positioning means comprises positioning holes formed through the lower housing body in a thickness direction.

4. The socket as set forth in claim 1, wherein each of the upper plungers comprises:
   an upper plunger body having a cylindrical shape;
   a probe provided on an upper end of the upper plunger body, the probe coming into contact with the corresponding terminal of the semiconductor chip; and
   a contact part provided under a lower end of the upper plunger body, the contact part coming into contact with the corresponding conductive part of the conductive sheet.

5. The socket as set forth in claim 4, wherein an annular protrusion is provided around a circumferential outer surface of the lower end of the upper plunger body.

6. The socket as set forth in claim 5, wherein a protrusion protrudes downwards from a lower end of the contact part.

7. The socket as set forth in claim 1, wherein through holes are formed through the base cover in the thickness direction thereof at positions adjacent to the coupling opening.

8. The socket as set forth in claim 1, wherein an upper depression is depressed downwards from the upper end of each of the conductive parts.

9. The socket as set forth in claim 8, wherein an upper seating recess is depressed downwards from a central portion of a bottom of the upper depression.

10. The socket as set forth in claim 1, wherein the base cover is coupled to the housing by bolt coupling.

11. The socket as set forth in claim 1, wherein recess holes are formed to predetermined depths in an upper surface of the insulation part of the conductive sheet.

12. The socket as set forth in claim 1, wherein a lower surface of the housing is adhered to the conductive sheet by a silicone adhesive.

13. The socket as set forth in claim 1, wherein each of the upper plungers comprises:
   an upper plunger body having a cylindrical shape;
   a probe provided on an upper end of the upper plunger body, the probe coming into contact with the corresponding terminal of the semiconductor chip;
   a contact part provided under a lower end of the upper plunger body, the contact part coming into contact with the corresponding conductive part of the conductive sheet; and
   a coupling hole formed through the upper plunger in an axial direction.

14. The socket as set forth in claim 13, wherein a coupling protrusion protrudes upwards from the upper end of each of the conductive parts, the coupling protrusion being inserted into the coupling hole of the corresponding upper plunger.

15. The socket as set forth in claim 1, wherein a lower depression is depressed upwards from the lower end of each of the conductive parts.

16. The socket as set forth in claim 15, wherein a lower seating recess is depressed upwards from a central portion of a bottom of the lower depression.

17. The socket as set forth in claim 16, wherein each of the lower plungers comprises:
   a lower plunger body having a cylindrical shape;
   a lower terminal contact part provided under a lower end of the lower plunger body, the lower terminal contact part coming into contact with the corresponding terminal of the PCB; and
   a conductive contact part provided on an upper end of the lower plunger body, the conductive contact part coming into contact with the corresponding conductive part of the conductive sheet.

18. The socket as set forth in claim 17, wherein a conductive protrusion protrudes upwards from an upper end of the conductive contact part.

19. The socket as set forth in claim 18, wherein an annular protrusion is provided around a circumferential outer surface of the lower plunger body.

* * * * *